United States Patent [19]

Lowdenslager et al.

[11] 4,282,595
[45] Aug. 4, 1981

[54] METHOD FOR DIGITAL FREQUENCY TRIMMING AN OSCILLATOR IN AN ELECTRONIC TIMEPIECE

[75] Inventors: John Lowdenslager, Norwalk; Norman C. Zatsky, Southbury, both of Conn.

[73] Assignee: Timex Corporation, Waterbury, Conn.

[21] Appl. No.: 106,173

[22] Filed: Dec. 21, 1979

[51] Int. Cl.³ .................... G04B 17/12; G04B 17/00
[52] U.S. Cl. .......................................... 368/200; 73/6
[58] Field of Search .................. 368/46, 47, 51, 56, 368/184, 186, 189, 200–202; 331/46–48, 162, 175, 176; 73/6

[56] References Cited

U.S. PATENT DOCUMENTS

| | | | |
|---|---|---|---|
| 3,722,255 | 3/1973 | Besson et al. | 73/6 |
| 3,895,486 | 7/1975 | Hammer et al. | 368/201 |
| 3,914,931 | 10/1975 | Tsuruishi | 368/201 |
| 4,023,344 | 3/1977 | Mukaiyama | 368/47 |
| 4,024,416 | 5/1977 | Fujima et al. | 368/201 |
| 4,044,547 | 8/1977 | Kusumoto | 368/189 |
| 4,051,663 | 10/1977 | Chihara et al. | 368/200 |
| 4,078,919 | 3/1978 | Busch et al. | 73/6 |
| 4,128,003 | 12/1978 | Zanoni et al. | 73/6 |
| 4,147,022 | 7/1979 | Ichikawa | 368/201 |
| 4,155,218 | 5/1979 | Wiget | 368/201 |
| 4,187,518 | 2/1980 | Martin et al. | 368/47 |
| 4,199,726 | 4/1980 | Bukosky et al. | 368/200 |

FOREIGN PATENT DOCUMENTS 1544449 4/1979 United Kingdom .
2006996 5/1979 United Kingdom .

OTHER PUBLICATIONS

*Basic Digital Electronics* Ray Ryan, Tab Books, 1975.

*Primary Examiner*—Vit W. Miska

[57] ABSTRACT

A method and apparatus for adjusting the frequency of piezoelectric crystal oscillator. The effective frequency of the oscillator is adjusted (trimmed) by periodically inhibiting pulses to the divider stage.

The pulse inhibit circuit includes a nonvolatile programmable read-only-memory (ROM) to store binary complement information corresponding to the number of oscillator pulses to be suppressed.

A counter is periodically preset with the binary complement information and the count advances in response to oscillator pulses. The difference count between the complement number and the counter's maximum count controls the number of pulses periodically suppressed.

During manufacture/assembly of the timepiece, the ROM is programmed to contain the desired complement information.

5 Claims, 3 Drawing Figures

FIG.2a  OSC. 1 PULSES

FIG.2b  126 OSC. 1 P.W.

METHOD FOR DIGITAL FREQUENCY TRIMMING AN OSCILLATOR IN AN ELECTRONIC TIMEPIECE

BACKGROUND OF THE INVENTION

The present invention relates to horology and more particularly to a method for adjusting (trimming) the effective frequency of an oscillator.

In recent years great interest has been shown in using piezoelectric crystal oscillators as highly accurate time bases in horological instruments.

However, it is difficult and, therefore, expensive to produce a small piezoelectric crystal having an exact predetermined frequency. For example, an error of only 0.01% (one part in ten thousand) in the frequency results in an error of about ten seconds a day or five minutes a month, which is unacceptable. This difficulty increases when the problems of mass production are considered.

The prior art typically discloses two types of correcting devices.

The first type corrects the frequency of the oscillator itself by means of a trimmer capacitor in series with the quartz crystal.

The second known type correcting device uses digital correction which is carried out by suppressing, at the input of the frequency divider, a certain number of pulses provided by an oscillator whose frequency is higher than a nominal value.

According to the present invention, a method and apparatus of the second type is provided.

An example of the second type of device is seen in U.S. Pat. No. 3,931,703 issued Jan. 13, 1976 to Igor Scherier et al. This patent discloses a device for correcting running of an electronic watch comprising two contactors acting on respective bistable circuits in turn acting on a combinatory circuit controlling a counter which provides binary correction information to an inhibitor circuit. The two push-buttons (contactors) are depressed, depending on the direction of correction required to advance or retard the displayed time. Thus, this device includes an operator programmable memory for manual time correction.

Another example of the second type of correction device is seen in U.S. Pat. No. 4,055,945 issued Nov. 1, 1977 to Jack Schwarzschild et al. This patent discloses a frequency adjustment device which is also programed by means of a switch arrangement that includes multi-position detent pin switches.

Other prior art patents which disclose frequency adjustment means are U.S. Pat. Nos. 3,540,207 issued Nov. 27, 1970 to E. R. Keeler; 3,914,706 issued Oct. 22, 1975 to Walter Hammer et al; 3,895,486 issued July 22, 1975 to Walter Hammer et al; 3,833,999 issued Sept. 10, 1974 to Irvin Budych et al; 4,004,447 issued Feb. 22, 1977 to Hans-Joachim Wolf Freinstein et al; and 4,093,877 issued June 6, 1978 to Jerald W. Vannier et al.

In contrast to the prior art, the present invention provides a method and apparatus which enables permanent frequency trim of an oscillator frequency, includes a nonvolatile programmable read-only-memory circuit (hereinafter ROM) programmed by electromagnetically detecting the uncorrected oscillator frequency and writing a correction (inhibit pulse) number permanently into the ROM, is adapted for mass manufacture and involves a minimum of process steps and associated parts/equipment.

SUMMARY OF THE INVENTION

According to the invention a method and apparatus is provided for adjusting the effective frequency of a crystal oscillator in a timepiece.

During manufacture, the oscillator frequency is detected by means of an electromagnetic pick-up probe which is coupled to a frequency determining device that compares oscillator frequency with a standard. The excess oscillator (pulse) cycle count per unit of time is determined and a (complement) binary number is written permanently into a programmable read only memory so as to be nonvolatile, i.e., it will retain the desired information during power interruptions.

A counter having a predetermined maximum count output (carry) signal is preset periodically to the complement number programmable into the ROM such that the difference between the complement number and the maximum count (difference number) equals the previously determined excess oscillator (pulse) cycle count.

A pulse inhibit circuit coupled to the counter inhibits a number of oscillator pulses corresponding to the difference number.

Accordingly, it is an object of the invention to provide a method and apparatus for adjusting the effective frequency of a piezoelectric crystal oscillator in an electronic watch during manufacture to an exact predetermined effective frequency being controlled by a nonvolatile electronic memory circuit device.

It is a further object of the invention to provide a method of adjusting the frequency of an oscillator during manufacture.

Another object of the invention is to provide an automatic digital frequency trim method and apparatus for economical manufacture of a timepiece having a quartz oscillator.

It is still a further object of the invention to provide a method and apparatus for correcting the effective frequency of a quartz crystal oscillator in an electronic watch whose output frequency in Hertz is above a predetermined time standard value. The watch contains a ROM of integrated circuit design and an inhibit circuit to periodically inhibit oscillator pulses in response to the information contained in the ROM. During manufacture, the frequency of the oscillator is electro-magnetically detected and compared with a standard to determine an excess frequency count which is representative of the magnitude in cycles or pulses the oscillator frequency is above the time standard per unit of time. This excess frequency count is written into the ROM and a high voltage potential is applied to the ROM circuitry to permanently fix or store the count information in the ROM.

It is a further object of the invention to provide a method and apparatus for digital frequency trim of a watch oscillator by incorporation of a nonvolatile memory in the watch circuit to retain information about correction, which is automatically fed into the memory during manufacture.

It is a further object of the invention to provide a method and apparatus for digital frequency trimming a watch oscillator during (mass) manufacture to provide quick adjustment of the time base with permanent incorporation of the correction information in the integrated circuit (watch) chip and requires a minimum of extra pads on the integrated circuit chip.

Further advantages and objectives of the invention will be apparent from the following detailed description of the preferred embodiment of the invention.

BRIEF DESCRIPTION OF THE DRAWINGS

FIGS. 2a and 2b illustrate the relationship between the oscillator pulses and the test set control pulse.

DETAILED DESCRIPTION OF THE INVENTION

Figure 1:
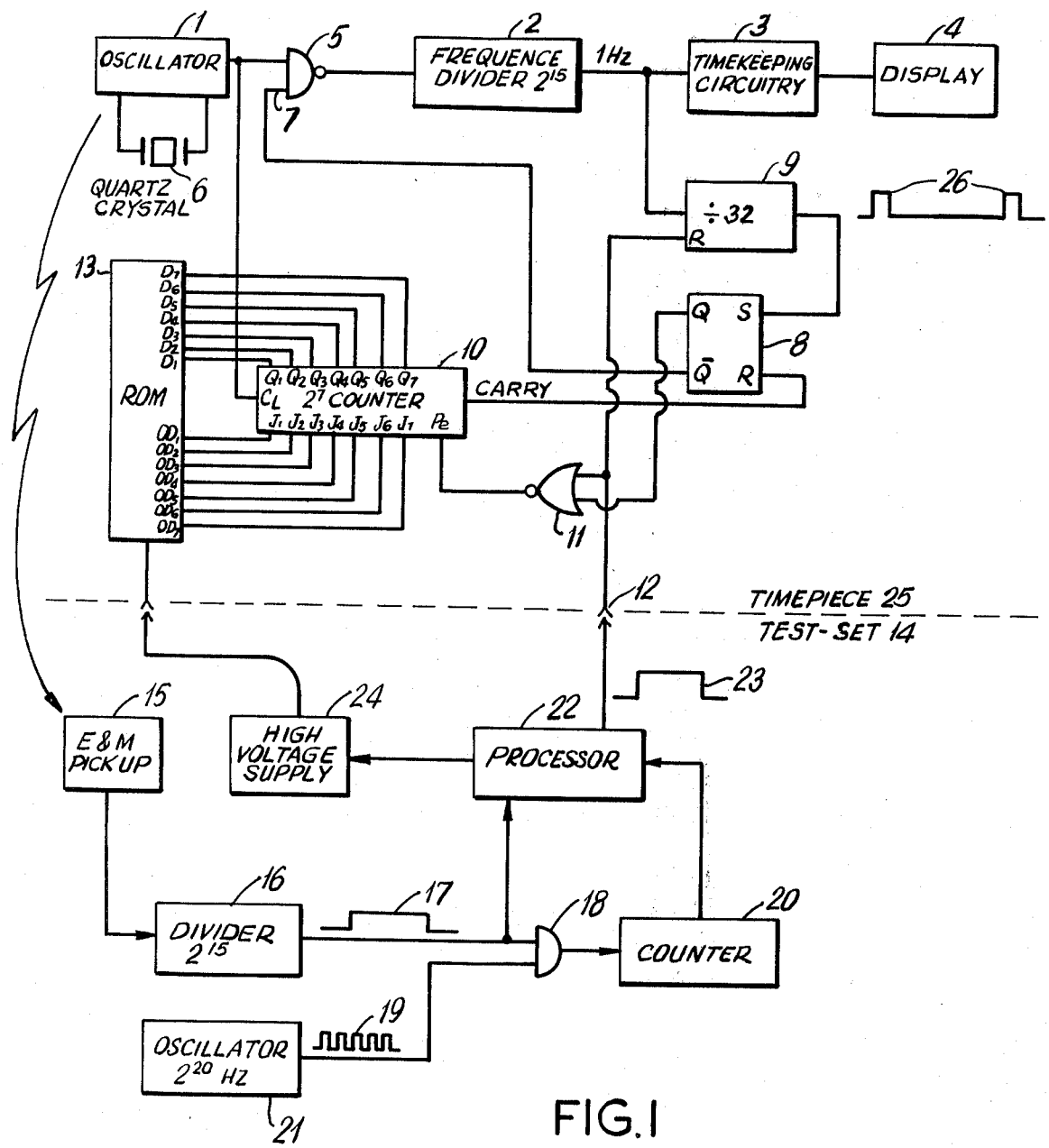
FIG. 1 is a block diagram of an electronic timepiece and apparatus for detecting and correcting the effective frequency of the oscillator in accordance with the present invention.

In accordance with the invention, an electronic watch is provided having a case and a source of electrical power, such as a battery cell. The watch includes a piezoelectric crystal oscillator 1 as its time base and a counting circuit, such as a series of frequency dividing (count-down) circuits 2 connected in tandem. The counting circuit provides an output at a predetermined and accurate rate to timekeeping circuitry 3 to operate a time display 4, for example, a digital display.

The piezoelectric crystal is small, so that it fits within the case of the watch. The crystal is not manufactured to a final and accurate predetermined frequency, which minimizes its cost. The crystal is manufactured so that its inherent frequency is somewhat above the desired frequency. The effective frequency of the crystal is adjusted by a pulse inhibit circuit. The pulse inhibit circuit periodically inhibits the desired number of oscillator pulses.

In accordance with the preferred embodiment of the invention, an inhibit NAND gate 5 is placed within the timepiece circuit to inhibit the oscillator pulses at the input stage of the count-down circuit 2.

The crystal 6 is, for example, a low-cost, wide-tolerance quartz crystal having an inherent frequency somewhat above the desired effective frequency of 32768 Hertz. The crystal controlled oscillator 1 is connected to one input of NAND gate 5. NAND gate 5 has its other input 7 connected to the $\overline{Q}$ output of flip-flop 8. The output of NAND gate 5 is connected to the count-down circuit 2.

NAND gate 5 provides an output pulse to the count-down circuit 2 for each pulse of the oscillator 1 when an enable (high) signal is applied to input 7. Conversely, if an inhibit signal, for example, a low at the $\overline{Q}$ output of flip-flop 8, is applied to input 7, oscillator pulses are prevented or inhibited from being applied to the count-down circuit 2.

Flip-flop 8 has a set input S connected to the output of divider 9, a reset input R connected to the carry output of counter 10 and its Q output connected to an input of NOR gate 11. Divider 9 has an input connected to the 1 hertz output signal of count-down circuit 2, a reset input R connected to an input of NOR gate 11 and the input terminal pad 12 on the integrated circuit (IC) watch chip.

Counter 10 consists of a seven-stage binary counter with provision for "look ahead" carry. The inputs consist of a single clock $C_L$, preset enable Pe, and seven individual jam inputs $J_1-J_7$. Seven separate Q outputs $Q_1-Q_7$ and a carry or second predetermined count signal are provided as outputs.

A high preset enable signal allows information on the jam inputs to preset the counter to any state asynchronously with the clock. A low on each jam line, when the preset-enable signal is high resets the counter to its zero count. The counter is advanced one count at the positive transition of the clock when the preset enable signal is low. Advancement is inhibited when the preset-enable $P_e$ signal is high. Since counter 10 consists of seven-stages, a carry signal representative of a 128 clock (pulse) count is generated with counter 10 preset to zero. The clock input $C_L$ is connected to the output of oscillator 1.

Outputs $Q_1-Q_7$ of counter 10 are connected to write inputs $D_1-D_7$, respectively, of a nonvolatile programmable read-only-memory (ROM) 13. The Jam inputs $J_1-J_7$ of counter 10 are connected to read outputs $OD_1-OD_7$ respectively, of ROM 13.

The manufacturing test-set 14 (shown below the dashed line) illustrates the equipment/method utilized to determine the oscillator error and to effect programming of the ROM 13.

During the manufacturing process, the oscillator 1 is energized to oscillate at its nominal frequency and to emit electromagnetic (E&M) waves having a frequency corresponding to the oscillator frequency. The E&M waves are detected by a pick-up probe device 15, such as is manufactured by Valpey-Fisher Corporation which provides a corresponding frequency signal to divider 16.

Divider 16 divides the oscillator 1 signal frequency by $2^{15}$ to provide an enable pulse 17 to AND gate 18. The duration of enable pulse 17 determines the number of high frequency pulses 19 coupled, via AND gate 18, to the input of counter 20.

The high frequency pulses 19 are provided by a precisely precalibrated reference oscillator 21.

The output count signal of counter 20 is coupled to micro-processor 22 which compares pulse 17 and the count information from counter 20 to provide a control pulse 23 to reset divider 9 and preset enable, via NOR gate 11, of counter 10. Following the trailing edge of control pulse 23, the high voltage supply 24, under control of processor 22, provides a high voltage pulse to ROM 13 which writes the count information on inputs $D_1-D_7$ permanently into its memory. The watch inhibit circuit will be explained with reference to FIGS. 1 and 2 for two examples; the first being when the crystal oscillator has the desired frequency and the second when the crystal oscillator is above the desired frequency.

If the oscillator 1 frequency is at the desired nominal frequency of 32768 Hertz, counter 20 will provide processor 22 with a zero count. In response to a zero count, processor 22 will provide a control pulse 23 having a width equal to 128 pulses to preset enable counter 10 and reset divider 9. Counter 10 being responsive to the clock input pulses counts to 128 at which point control pulse 23 goes low disabling the preset enable. The 128 count is coupled to the $D_1-D_7$ inputs of ROM 13 and permanently written in memory with the application of a high voltage signal from supply 24.

With the watch now removed from the test set, and flip-flop 8 in the reset state, the low Q output via NOR gate 11 preset enables counter 10 causing the 128 count at jam inputs $J_1-J_7$ to preset the counter 10 and provide a carry signal to flip-flop 8. The high $\overline{Q}$ output also enables gate 5 to transmit pulses from oscillator 1 to frequency divider 2. Every 32 seconds, a pulse from divider 9 to the set input of flip-flop 8 causes its Q output to go high momentarily, but the carry output of counter 10 causes it to go low immediately. The corresponding low on the Q output also resets immediately, so that no pulses are inhibited by gate 5.

Thus, the effective frequency at the input of frequency divider 2 is uncorrected and equal to the oscillator 1 assumed nominal frequency of 32768 hertz.

If it is assumed that oscillator 1 is manufactured to have a nominal frequency above the desired watch operating frequency of 32768 hertz, for example, a frequency of 32771 hertz, enable pulse 17 will have a shortened duration or pulse width due to the higher oscillator frequency. Processor 22 responds to a shorter pulse 17 and the pulse count output of counter 20 by causing the control pulse 23 to be reduced in duration, for example, to correspond to 32 pulses of oscillator 1 for the above high frequency of 32771 hertz. Pulse 23 enables, via preset enable $P_e$, counter 10. At a count of 32 counter 10 is disabled and this count is written into ROM 13 by application of a high voltage signal from supply 24. In this manner, ROM 13 forms a nonvolatile read-only-memory.

With watch 25 decoupled from test-set 14, the inhibit circuit automatically effects a frequency correction to oscillator 1 by periodically inhibiting the predetermined excess pulses which equals the difference between the stored count of 32 and the maximum count 128 of counter 10.

Flip-flop 8 is normally in the reset mode with its $\overline{Q}$ output high to enable NAND gate 5 and its Q output low causing a high on the preset enable to counter 10. A high preset enable signal allows information on the jam inputs $J_1$-$J_7$, i.e., the count of 32 from ROM 13, to preset counter 10.

Divider 9 provides a set pulse 26 to the set input S of flip-flop 8 after every 32nd one hertz pulse output from divider 2 causing $\overline{Q}$ to go low and Q to go high. The low on $\overline{Q}$ disables NAND gate 5. The high on Q on Q is inverted by NOR gate 11 to provide a low preset enable signal. The low preset enable signal enables counter 10 to advance one count at each positive transition of the clock, i.e., with each pulse from oscillator 1. Since counter 10 was preset to a count of 32 it will provide a carry signal after 96 clock (oscillator 1) pulses. Thus, with the oscillator 1 frequency 3 hertz above the nominal desired frequency of 326768, 96 excess pulses are generated by oscillator 1 between successive pulses 26 from flip-flop 9. With counter 10 preset to the difference count between 96 and the maximum count of counter 10, i.e., 128−96=32, the inhibit circuit will block the next 96 pulses from oscillator 1 until counter 10 reaches its maximum count to reset flip-flop 8.

In the above example, the effective frequency at the input divider 2 is three hertz lower than the frequency of oscillator 1, thus effecting the desired frequency correction. The preferred embodiment contemplates a timepiece or watch 25 having a customized integrated circuit (IC) chip designed to include the watch circuitry and inhibit control circuit including the ROM 13 and counter 10.

While the invention has been described with respect to preferred embodiment, it should be apparent to those skilled in the art that numerous modifications may be made thereto without departing from the spirit and scope of the invention.

We claim:

1. A method for trimming the frequency of a piezoelectric crystal oscillator in a timepiece having a count-down circuit coupled to the oscillator to receive an input signal therefrom and provide a lower frequency output signal, time indicating means coupled to the count-down circuit to be activated thereby, the piezoelectric crystal oscillator having a nominal frequency above a desired frequency, and an inhibit circuit means to periodically start blocking of oscillator pulses and preset a counter to a first count number stored in a nonvolatile memory circuit, said counter being responsive to the output of the oscillator for increasing the count preset therein to a second predetermined count, said inhibit circuit means stopping the blocking of oscillator pulses in response to the second predetermined count of said counter, wherein said first count number is determined and written into said nonvolatile memory circuit, including the steps of:

detecting signals externally indicating untrimmed oscillator frequency generated by the untrimmed oscillator;

determining the first count number such that the difference count between the first and second count equals the frequency difference between the untrimmed oscillator and the desired frequency;

permanently writing the first count into said memory circuit.

2. A method of the type described in claim 1 wherein:

detecting oscillator signals is effected by an electromagnetic pick-up probe.

3. A method of trimming the frequency of a quartz crystal controlled oscillator in a wristwatch having a count-down circuit coupled to the oscillator to receive an input signal therefrom and provide a lower frequency output signal, time indicating means being coupled to the count-down circuit to be activated thereby, said quartz crystal controlled oscillator having a nominal frequency above a predetermined desired frequency, and an inhibit circuit means comprising a NAND gate connected between the oscillator and the count-down circuit, said NAND gate blocking oscillator pulses to the count-down circuit upon an inhibit signal from a flip-flop circuit, said flip-flop circuit generates the inhibit signal in response to a periodic output signal from a divider circuit responding to signals from the count-down circuit, a nonvolatile memory circuit programmed to provide output signals indicative of a first count, a presettable counter coupled to said output signals of the memory circuit and being preset to a count equal to said first count in response to a preset enable signal from the flip-flop circuit and thereafter rendered receptive to oscillator signals for increasing the count of said counter to its maximum count, said flip-flop circuit being responsive to a maximum count signal from said counter to remove said inhibit signal to the NAND circuit whereby oscillator pulses are coupled to the count-down circuit, wherein said memory circuit is programmed, including the steps of:

detecting signals externally indicating untrimmed oscillator frequency generated by the untrimmed oscillator;

determining a frequency difference between the oscillator frequency and the desired frequency;

applying a control pulse to the counter causing it to up-count with oscillator signals and stopping the counter at the first count wherein the difference count between the first count and maximum count of the counter equals the frequency difference between the untrimmed oscillator frequency and the desired frequency per unit of time;

applying a signal to the memory circuit causing it to store the first count.

4. A method of the type described in claim 3 wherein the oscillator signals are detected by an electromagnetic pick-up probe.

5. A method of the type described in claim 3 wherein determining the difference between the oscillator frequency and the desired frequency includes the steps of (a) frequency dividing the untrimmed oscillator pulses to obtain a gate enable pulse having a width dependent on the frequency of the untrimmed oscillator, (b) measuring the number of pulses of a high frequency standard which corresponds to the pulse width of the gate enable pulse, (c) comparing the measured number of high frequency pulses to a predetermined number, (d) providing a control pulse having a pulse width corresponding to the difference between the measured number of high frequency pulses and the predetermined number, (e) applying a memory write pulse to the memory circuit following the control pulse.

* * * * *